Sept. 14, 1965 W. A. FORDECK 3,206,561

EXPANSIBLE MULTIPLE CONTACT SWITCH

Filed Nov. 2, 1961

INVENTOR.
WILLIAM A. FORDECK
BY
Lockwood, Woodard, Smith & Weikart
Attorneys

United States Patent Office 3,206,561
Patented Sept. 14, 1965

3,206,561
EXPANSIBLE MULTIPLE CONTACT SWITCH

William A. Fordeck, Garrett, Ind., assignor to The Magnavox Company, Fort Wayne, Ind., a corporation of Delaware Filed Nov. 2, 1961, Ser. No. 149,614
6 Claims. (Cl. 200—5)

This invention relates generally to electrical switches, and more particularly to an electrical switch wherein a plurality of electrical conductors may be simultaneously electrically interconnected by a single conductive switch member.

The electrical switch art includes countless varieties of switches. These are switches which provide for electrical interconnection of a number of circuits in response to the actuation of a switch member. These include switches utilizing rotary or translational types of motion. Usually they are comparatively bulky, heavy, and expensive. Moreover, because of their complexity, they do not have the durability and reliability that is necessary in many applications.

Considerably fewer switches are available in the printed circuit art, than are available to one working with wired circuitry. Yet, printed circuits are constantly achieving increasing importance. To mention several reasons for the advance of printed circuits, one is cost savings, and another is space savings which can be realized by their employment.

There is a great deal of interest in developing components for use with printed circuits, and which have a minimal space requirement and yet are readily employed with the printed circuits and reliable in operation. One component frequently necessary in printed circuitry, is a switching device for simultaneously electrically interconnecting a group of circuits. As an example of an instance where such a switch is required, electronic organ circuitry may be mentioned. In electronic organs, it is desirable to connect together various tone generating circuits simultaneously by actuation of a chord button to produce harmonious musical chords. To provide for a variety of chords, a multiplicity of printed circuit cards, each containing various circuit combinations, can be provided for control by a multiplicity of chord buttons. By stacking printed circuit boards, if switching components are small enough, a large number of buttons, representing many chord combinations, can be clustered in a small space.

It is, therefore, a general object of this invention to provide an improvement in electrical switches.

It is a further object of this invention to provide an electrical switch well suited to employment with printed circuitry.

It is a still further object of this invention to provide an electrical switch whereby a single electrically conductive member can be activated to electrically interconnect a plurality of printed circuit conductors.

It is a still further object of this invention to provide a device of the foregoing character requiring a minimum of space and yet insuring reliability of operation.

It is a still further object of this invention to provide a switch of the foregoing character having a configuration whereby a multiplicity of printed circuit boards incorporating like switches may be closely stacked and spaced so that a large number of switch operating buttons may be clustered in a small area.

It is a still further object of this invention to provide a switch of the foregoing character which is economically manufactured.

Described briefly as incorporated in a printed circuit board, a typical embodiment of this invention comprises a plurality of printed conductors disposed around a hole through the circuit board. The printed lines terminate around the hole in spaced relation with the edge thereof. A garter type of coil spring is disposed on the board around the hole, and in its normal condition, rests in the space between the hole and the terminations of the electrical conductors. It does not touch the electrical conductors in this condition.

A switch member operable by a button or the like, includes a shaft passing through the hole in the printed circuit board. Slightly above the hole in the board, the switch member includes a tapered actuator, the taper being in the form of a conical surface facing the conductors on the board. The conical surface engages the inside of the garter spring. By depressing the switch button, the conical surface serves to expand the garter spring to a position where it contacts the electrical conductors surrounding the hole in the board. The electrically conductive surface of the garter spring thereby electrically interconnects the conductors disposed around the hole in the board.

The full nature of the invention will be understood from the accompanying drawings and the following description and the claims.

Figure 1:
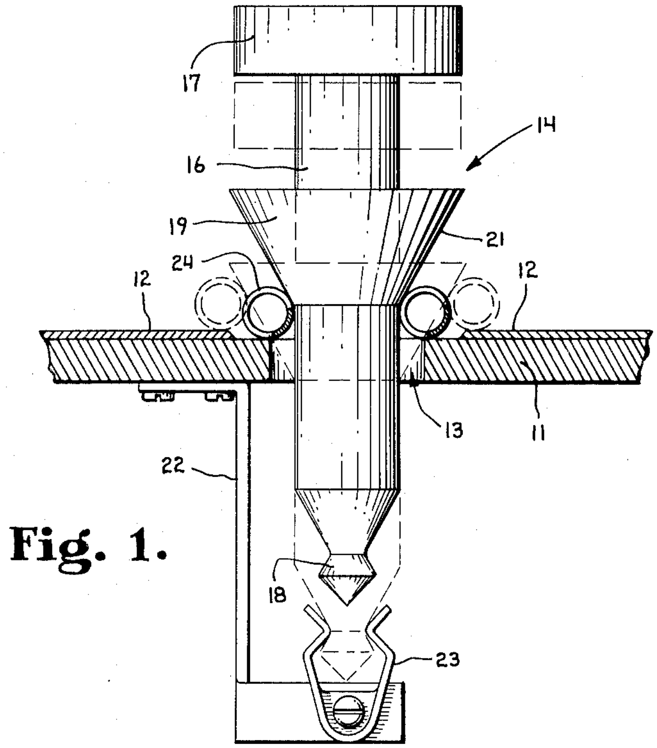
FIG. 1 is a section through a switch assembly according to this invention taken on a plane through the center of the hole in the printed circuit board and transverse to the plane of the board.
Figure 2:
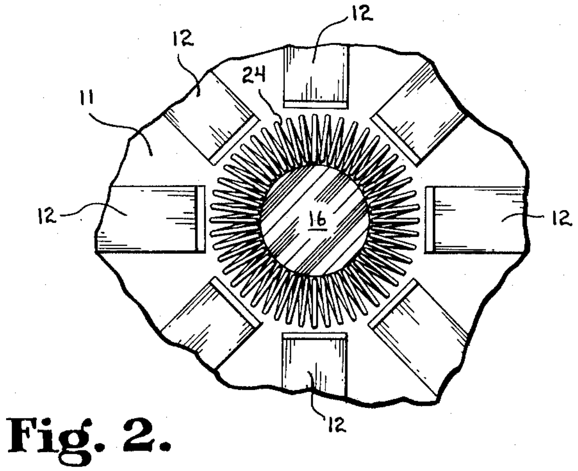
FIG. 2 is a plan view of a switch assembly according to this invention, with a portion of the switch member cut away to better illustrate certain details.

Referring to the drawing, printed circuit board 11 has a plurality of electrical conductors 12 thereon converging toward the hole 13 therethrough. A switch member 14 includes the shaft 16 with a button 17 at its upper end and with the locking knob 18 at its lower end. The switch is shown in its deactivated position by the solid lines and in its activated position by dotted outlines. The switch member includes an actuator 19 thereon having a conical surface 21 facing the electrical conductors 12 on the printed circuit board. A rigid frame is designated schematically by the reference numeral 22 and may be considered to provide support for the printed circuit board as well as for the switch member locking clip 23. It should be understood, of course, that the locking knob on the switch member and the locking clip 23 are merely used to suggest one possible means of holding the switching member in the activated position upon being depressed. Clearly, a wide variety of locking and interlocking means is available and could be substituted for the arrangement shown.

A coil spring 24, is provided in the form of a doughnut and is commonly referred to as a garter spring. By way of example, the coil spring may be formed from .008 spring wire into a coil of 5/16 inch diameter, space-wound with approximately fifty turns and secured end-to-end by a twisting operation. The material of the spring could, for example, be a phosphor bronze and silver plated.

The garter spring is shown disposed on the board 11 and encircling the lower portion of the shaft 16. Normally, the spring is provided having an inside diameter such that in the normal condition of the spring it lightly engages the outside diameter of the shaft. At the same time, the lower portion of the conical surface 21 also engages the garter spring.

As shown in the drawings, the garter spring rests on the board in the space between the termination of the conductors 12 and the circumference of the hole 13. Depression of the button causes the conical surface 21 to expand the spring 24 whereby it is effective to cover the printed circuit conductors terminating around the hole as indicated by the dotted outlines in FIG. 1. In this manner, all of the conductors may be electrically interconnected by the garter spring.

It should be apparent, that a wide variety of possible constructions could be employed which would be within the scope of this invention. For example, not all of the electrical conductors would need to terminate at the same spacial distance with respect to the hole 13. Accordingly, the switch member could be provided with several switching positions whereby more or less of the electrical conductors could be interconnected as desired. Also, it is possible that electrical conductors would be disposed immediately adjacent the hole 13, such as, for example, if the conductors were passed through the hole from the lower side of the board. In this instance, the garter spring would normally interconnect the conductors and would function to disconnect them upon depression of the switch button.

Still another contemplated variation would provide in place of the strictly conical surface, a generally conically surface such as could be generated by revolving a curved line about the axis of the shaft 16. The surface 21 could then be concave conical or convex conical.

Considering still further possible variations within the scope of the invention, an electrically conductive elastomer could be provided in place of the garter spring or an elastomer having an electrically conductive surface thereon. The electrical effect would, of course, be modified according to the respective resistance of the materials employed. A still further possible modification would be to cover portions of the electrical conductors with insulating material at various diameters out from the center of the hole in the board, and obtain a multiplicity of electrical combinations depending on the distance the switch button is depressed from its initial condition. A still further modification would involve deletion of the hole in the printed circuit board entirely, so long as dimensions are such as to permit proper functioning according to the invention. For example, the diameter of the coil of the garter spring could be increased substantially whereby proper actuation could be obtained without depressing the switch button far enough to cause premature interference between the switch member and the circuit board.

Therefore, while the invention has been disclosed and described in some detail in the drawings and foregoing description, they are to be considered as illustrative and not restrictive in character, as other modifications may readily suggest themselves to persons skilled in this art and within the broad scope of the invention, reference being had to the appended claims.

The invention claimed is:

1. A switch assembly comprising:
a non-conductive support carrying an array of coplanar electrical conductors having their ends disposed in spaced relation to one another to provide an exposed area of said support common to said conductors;
a switch member having a generally conical surface thereon disposed adjacent said exposed area;
and an expansible member normally disposed on said exposed area of said support adjacent the ends of said conductors, said expansible member having an electrically conductive surface and encircling said switch member, said switch member being movable in one direction to engage the conical surface with said expansible member to expand and slide said expansible member from said exposed area into engagement with said electrical conductors to electrically interconnect them and movable in the opposite direction to slide said expansible member out of engagement with said electrical conductors.

2. A switch assembly according to claim 1 wherein means for locking said switch member is mounted on said support adjacent the path of movement of said switch member for locking it in a given position after movement in one of said directions.

3. A switch assembly comprising:
a non-conductive printed circuit board having an aperture and carrying an array of coplanar electrical conductors, spaced from and extending radially outwardly of said aperture;
a switch member having a generally conical surface thereon and extending through said aperture;
and an expansible member normally disposed on said board and spaced inwardly of the inner ends of said conductors, said expansible member having an electrically conductive surface and encircling said switch member, said switch member being movable in one direction to engage the conical surface with said expansible member to expand and move said expansible member over and into engagement with said electrical conductors to electrically interconnect them and movable in the opposite direction to move said expansible member out of engagement with said electrical conductors.

4. A switch assembly comprising:
a non-conductive printed circuit board having an exposed area and carrying an array of coplanar electrical conductors, bordering and extending radially outwardly of exposed area each of said conductors being of ribbon form and electrically distinct from each other;
a switch member having a generally conical surface thereon and extending over said exposed area;
an annular conductive coil spring normally disposed on said exposed area of said board and spaced inwardly of the inner ends of said conductors, said spring encircling said switch member, said switch member being movable in one direction to engage the conical surface with said spring to expand and move said spring into engagement with said electrical conductors to electrically interconnect them and movable in the opposite direction to move said spring out of engagement with said electrical conductors.

5. A switch assembly comprising:
a non-conductive support having an aperture and carrying an array of coplanar electrical conductors, spaced from and extending radially outwardly of said aperture, each of said conductors being of ribbon form and electrically distinct from each other;
a switch member having a generally conical surface thereon and extending through said aperture;
and a resilient garter member normally disposed on said support and spaced inwardly of the inner ends of said conductors, said garter member having an electrically conductive surface and encircling said switch member, said switch member being movable in one direction to engage the conical surface with said garter member to stretch and move said garter member over the ends of and into engagement with said electrical conductors to electrically interconnect them and movable in the opposite direction to move said garter member out of engagement with said electrical conductors.

6. A switch assembly comprising:
a non-conductive support having an aperture and carrying an array of coplanar electrical conductors, spaced from and extending radially outwardly of said aperture, each of said conductors being of ribbon form and electrically distinct from each other;
a switch member having a generally conical surface thereon and extending through said aperture;
a resilient garter member normally disposed on said support and spaced inwardly of the inner ends of said conductors, said garter member having an electrically conductive surface and encircling said switch member, said switch member being movable in one direction to engage the conical surface with said garter member to stretch and move said garter member over the ends of and into engagement with said electrical conductors to electrically interconnect them and movable in the opposite direction to move said garter member out of engagement with said electrical conductors;

and means mounted on said support adjacent the path of movement of said switch member for locking said switch member in garter engaging position.

References Cited by the Examiner

UNITED STATES PATENTS

| | | | |
|---|---|---|---|
| 959,435 | 5/10 | Thomson | 200—166 |
| 1,448,058 | 3/23 | Eis et al. | 200—163 |
| 2,906,990 | 9/59 | Cain et al. | 339—247 |

FOREIGN PATENTS

| | | |
|---|---|---|
| 29,822 | 12/14 | Great Britain |

BERNARD A. GILHEANY, *Primary Examiner.*

ROBERT K. SCHAEFER *Examiner*